United States Patent
Bailey

(10) Patent No.: US 6,449,728 B1
(45) Date of Patent: Sep. 10, 2002

(54) SYNCHRONOUS QUAD CLOCK DOMAIN SYSTEM HAVING INTERNAL AND EXTERNAL SAMPLE LOGIC UNITS MATCHING INTERNAL AND EXTERNAL SAMPLE SIGNATURES TO A PATTERN CORRESPONDING TO A SYNCHRONOUS MULTIPLE RATIO

(75) Inventor: Bradley E. Bailey, Phoenix, AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/387,211

(22) Filed: Aug. 31, 1999

(51) Int. Cl.[7] .............................. H03L 7/091; G06F 1/12
(52) U.S. Cl. ........................ 713/503; 713/400; 713/401; 713/500; 327/146; 327/150; 327/156; 327/159
(58) Field of Search .................... 327/141, 144–147, 327/155, 162, 163, 291, 292, 295, 150, 159; 713/400, 401, 500, 501, 503

(56) References Cited

U.S. PATENT DOCUMENTS

| | | | | |
|---|---|---|---|---|
| 4,694,472 A | * | 9/1987 | Torok et al. ................. | 327/141 |
| 4,704,574 A | * | 11/1987 | Nossen ...................... | 324/76.47 |
| 5,295,164 A | * | 3/1994 | Yamamura ................... | 327/159 |
| 5,663,687 A | * | 9/1997 | Kozu ......................... | 327/156 |
| 6,081,143 A | * | 6/2000 | Ho et al. .................... | 327/166 |
| 6,338,127 B1 | * | 1/2002 | Manning ..................... | 711/167 |

FOREIGN PATENT DOCUMENTS

JP      11-127141    *   5/1999

* cited by examiner

*Primary Examiner*—Jeffrey Gaffin
*Assistant Examiner*—Ilwoo Park
(74) *Attorney, Agent, or Firm*—S. Kevin Pickens; Kevin D. Wills

(57) ABSTRACT

A synchronous quad clock domain system synchronizes an external primary and secondary clock (130, 132) with an internal primary and secondary clock (134, 136). The rising edge of the internal primary and secondary clock signals are matched and a synchronous multiple ratio is applied to the internal primary clock signal to produce the internal secondary clock signal. The phase of the internal and external secondary clock signals are matched. The external secondary clock signal is sampled to produce a external sample signature and the external sample signature is matched to a pattern corresponding to the synchronous multiple ratio to produce an external clock cycle signal. The internal secondary clock signal is also sampled to produce an internal clock cycle signal. The internal and external clock cycle signals are compared and a phase adjust signal is provided to match the phase of the internal and external secondary clock signals.

6 Claims, 4 Drawing Sheets

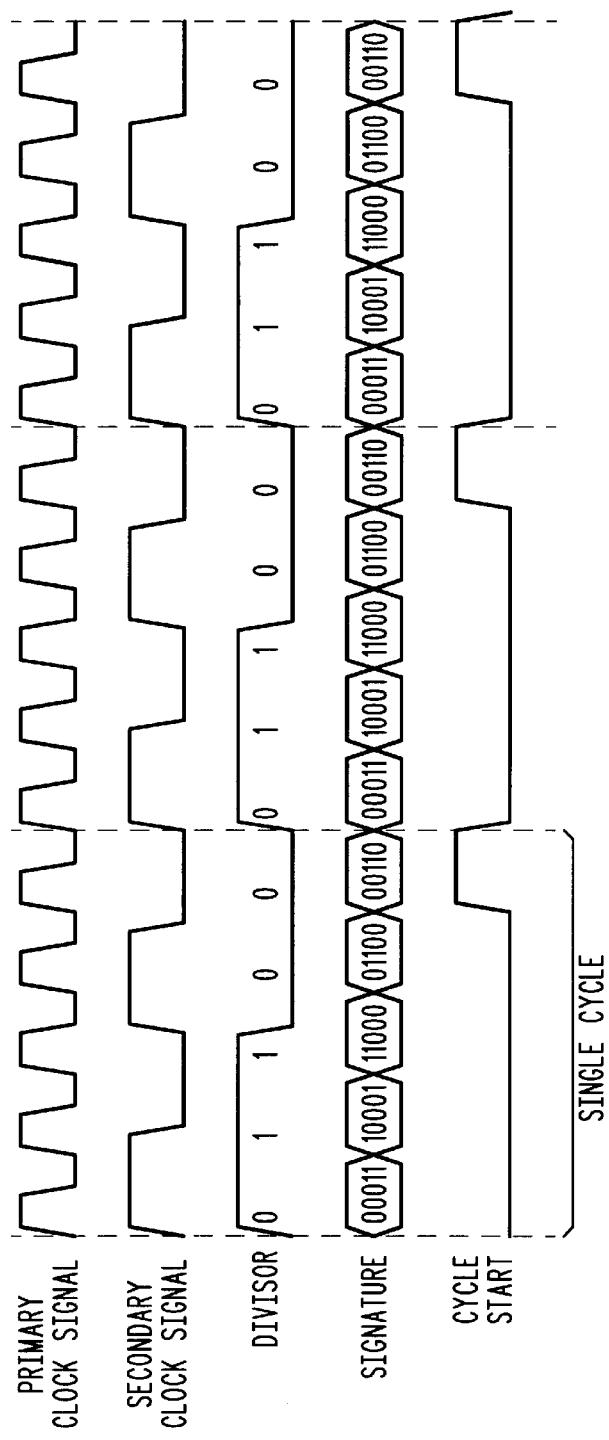

SYNCHRONOUS QUAD CLOCK DOMAIN SYSTEM HAVING INTERNAL AND EXTERNAL SAMPLE LOGIC UNITS MATCHING INTERNAL AND EXTERNAL SAMPLE SIGNATURES TO A PATTERN CORRESPONDING TO A SYNCHRONOUS MULTIPLE RATIO

FIELD OF THE INVENTION

The present invention relates generally to computer systems and, more specifically, to computer system clock synchronization.

BACKGROUND OF THE INVENTION

A conventional computer system includes a clock that controls the timing of the computer functions it performs. Such a computer system may have two clocks controlling the functions performed by two separate clock domains. For example, a computer system may have a primary clock controlling a clock domain devoted to processor functions and a secondary clock controlling a clock domain devoted to input/output functions. In such an environment, the primary clock and secondary clock must be synchronized to function correctly.

Such a computer system typically is implemented on a circuit board. The circuit board may contain a subsystem implemented with a chip such as an ASIC (Application Specific Integrated Circuit) that has its own internal clock control. In such a system, the ASIC may also have two internal primary and secondary clocks. In such a system, the external system clocks must be synchronized with the internal ASIC clocks. Also, the internal primary and secondary clocks must be synchronized to function correctly. Thus, a means is desirable for providing an efficient and effective synchronization of all four clock domains.

BRIEF DESCRIPTION OF THE DRAWINGS

FIG. 5 is a table showing the sampled clock signature associated with each synchronous multiple ratio; and FIG. 6 is a timing chart that illustrates the identification of a single clock cycle based on the sampled clock signature.

DESCRIPTION OF THE PREFERRED EMBODIMENT

Figure 1:
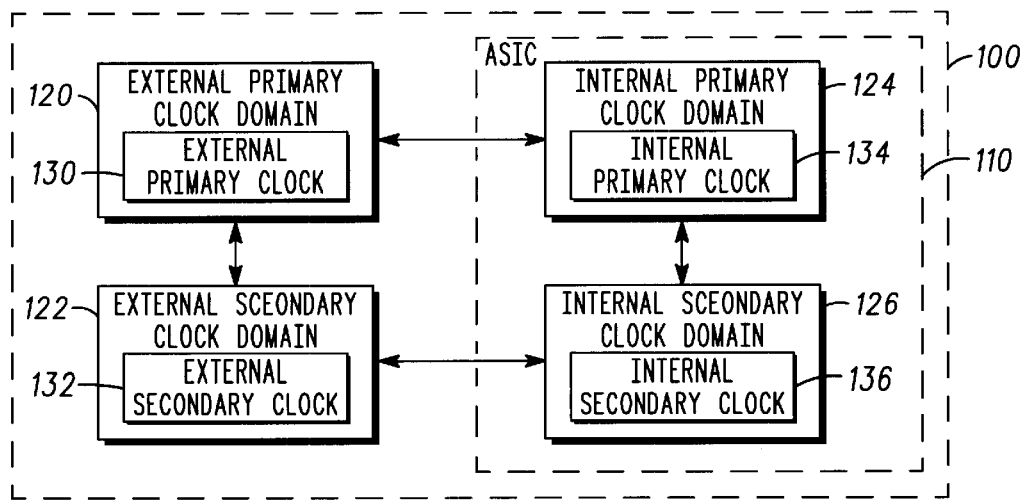
FIG. 1 is a higher level diagram showing the relationship among the clock domains.

In a preferred embodiment of the invention, a synchronous quad clock domain system synchronizes an external primary clock domain, an external secondary clock domain, an internal primary clock domain and an internal secondary clock domain. FIG. 1 is a higher level diagram showing the relationship among the clock domains in the preferred embodiment of the invention. The preferred embodiment is implemented in a computer system 100 having an ASIC 110.

In this case, the external primary clock domain 120 is a system primary clock domain in which the external primary clock 130 controls primary system functions with an external primary clock signal. The external secondary clock domain 122 is a system secondary clock domain in which the external secondary clock 132 controls secondary system functions with an external secondary clock signal. Similarly, the internal primary clock domain 124 is an ASIC primary clock domain in which the internal primary clock 134 controls primary ASIC functions with an internal primary clock signal. The internal secondary clock domain 126 is an ASIC secondary clock domain in which the internal secondary clock 136 controls secondary ASIC functions with an internal secondary clock signal.

In the one possible embodiment of the invention, the external primary clock domain 120 is an external processor clock domain in which the external primary clock 130 controls processor functions for the system. The external secondary clock domain 122 is an external input/output a clock domain in which the external secondary clock 132 controls input/output functions for the system. Similarly, the internal primary clock domain 124 is an internal processor clock domain in which the internal primary clock 134 controls processor functions for the ASIC 110. The internal secondary clock domain 126 is an internal input/output clock domain in which the internal secondary clock 136 controls input/output functions for the ASIC 110.

Figure 2:
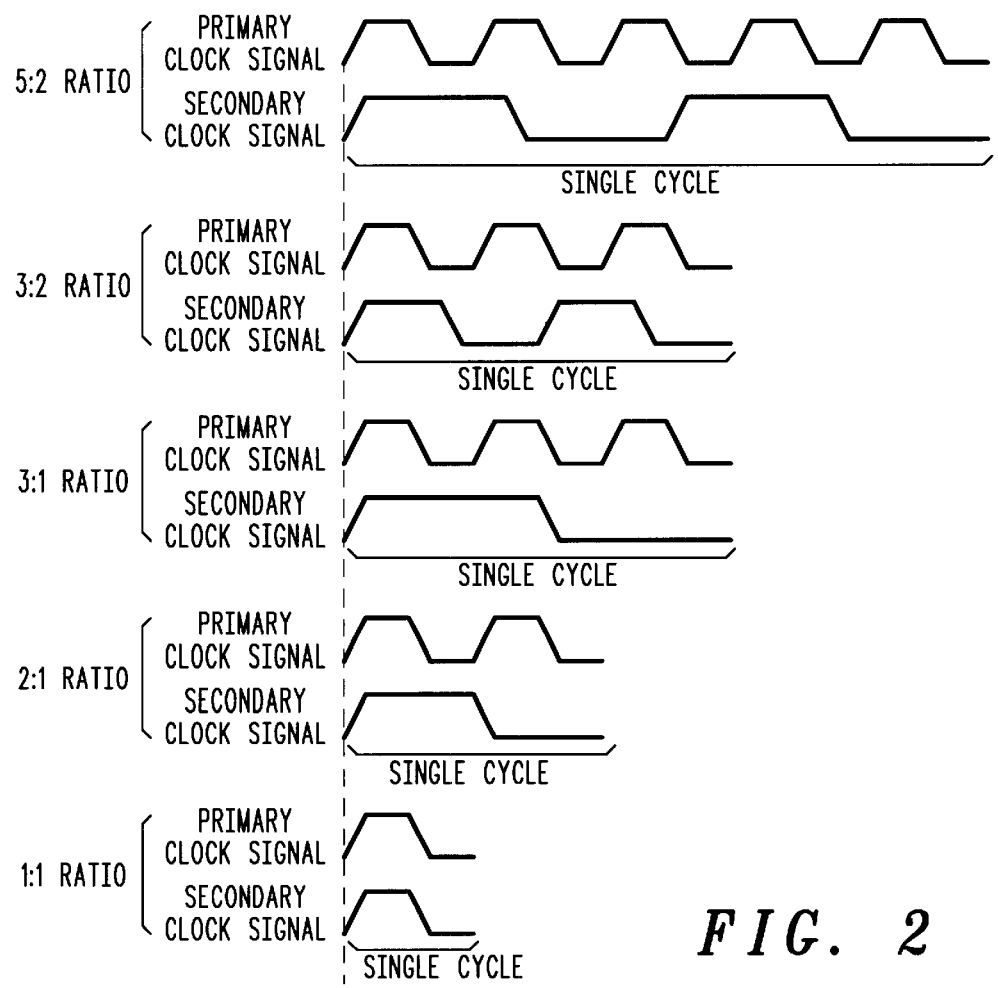
FIG. 2 is a timing chart that shows the relationship between single clock cycles in the external primary and secondary clock domains.

The primary clock signals are synchronized with the secondary clock signals by a synchronous multiple ratio. This allows for numerous processor and bus speed options while providing maintainable synchronization. The preferred embodiment defines the synchronous multiple ratio with a five ratio design in which the frequency of the external primary clock signal compares to the frequency of the external secondary clock signal by a ratio of either 1:1, 2:1, 3:1, 3:2 or 5:2. FIG. 2 is a timing chart that shows the relationship between single clock cycles in the external primary and secondary clock domains for each of the five ratios. In each case, the primary clock signal and secondary clock signal are synchronized such that the rising edge at the beginning of each single clock cycle of the primary and secondary clock signal occur at the same time. One of ordinary skill in the art will readily accomplish such a synchronization between the external primary clock 130 and external secondary clock 132 based on the description herein, in light of existing knowledge in the field. Synchronization of the internal primary clock 134 and internal secondary clock 136 will be described below.

Figure 3:
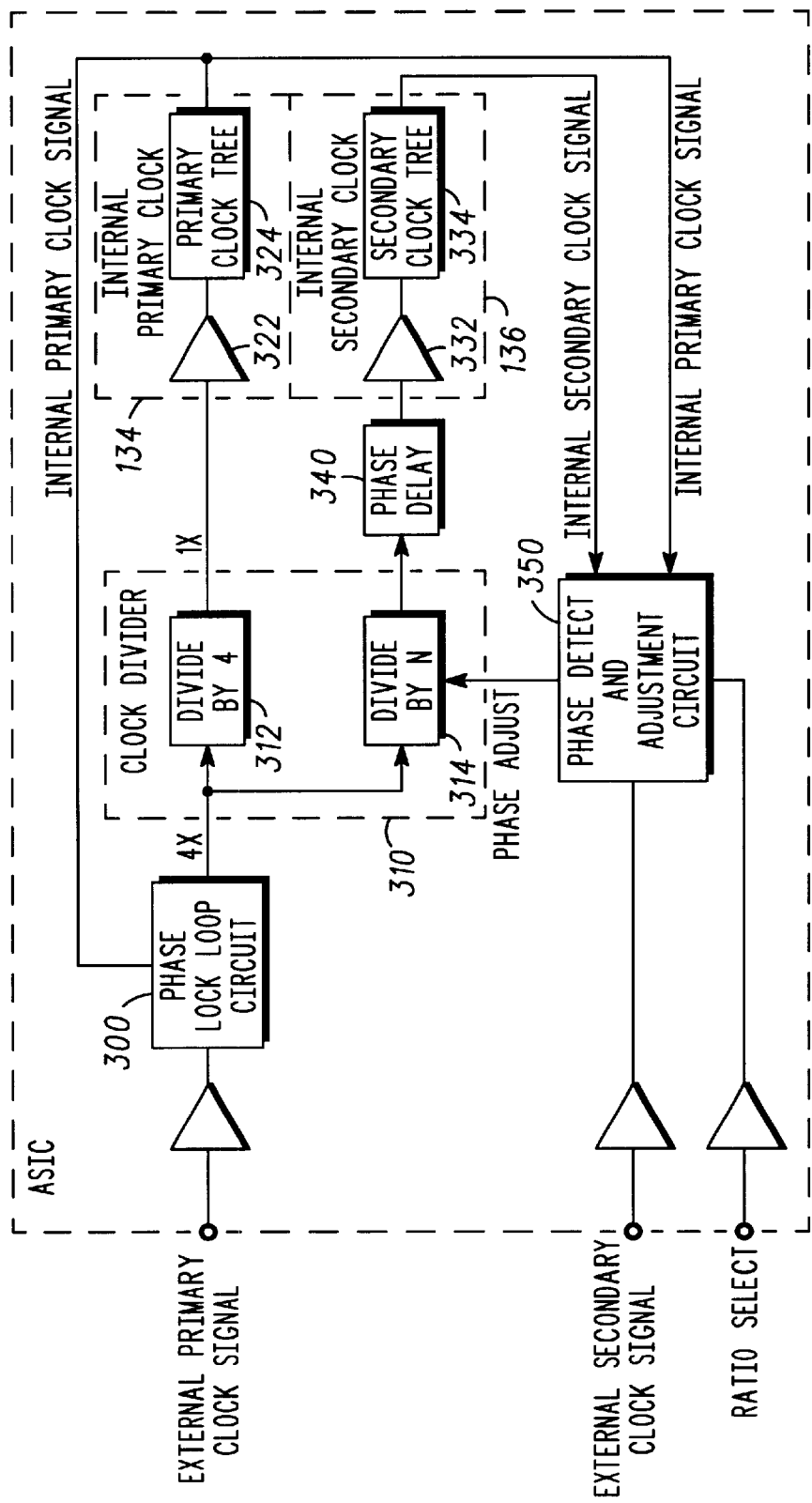
FIG. 3 is a circuit diagram of the clock synchronization logic portion of an ASIC in an embodiment of the present invention.

FIG. 3 shows the clock synchronization logic portion of the ASIC 110. A phase lock loop circuit 300 synchronizes the internal primary clock signal with the external primary clock signal. A clock divider 310 applies the synchronous multiple ratio to the internal primary clock signal to produce the internal secondary clock signal. The clock divider 310 multiplies the external primary clock signal by a synchronous multiple ratio factor. The clock divider 310 divides the external primary clock signal by the synchronous multiple ratio factor to produce the internal primary clock signal. The clock divider 310 divides the external primary clock signal by a synchronous multiple ratio dividend corresponding to the synchronous multiple ratio to produce the internal secondary clock signal.

Specifically, in an implementation having the five ratio design described above, the clock divider 310 multiplies the external primary clock signal by 4×. A divide by four circuit 312 divides the 4× internal secondary clock signal by 4 and provides the resulting 1× clock signal via a root buffer 322 to a primary clock tree 324 to effectuate the internal primary clock 134 and produce the internal primary clock signal. A divide by n circuit 314 divides the 4× external primary signal by n to produce the resulting 4×/n clock signal, where n=4, 6, 8, 10 or 12 for a synchronous multiple ratio of 1:1, 3:2, 2:1, 5:2 or 3:1, respectively. The divide by n circuit 314 provides the internal secondary clock signal via a root buffer 332 to a secondary clock tree 334 to effectuate the internal secondary clock 136 and produce the internal secondary clock signal.

A phase delay circuit 340 matches a rising edge of the internal secondary clock signal with a rising edge of the internal primary clock signal. The phase delay circuit 340 delays the phase of the internal secondary clock signal to match the rising edge clock insertion delay of the primary clock tree 324 with that of the secondary clock tree 334. The phase delay circuit 340 is implemented, for example, with wireload delays and buffer/inverter combinations. Clock insertion delay is verified using static timing over all operating conditions of the ASIC 110. The combination of the phase lock loop circuit 300 and the phase delay circuit 340 minimizes skew between the rising edges of the external clocks and internal clocks.

Figure 4:
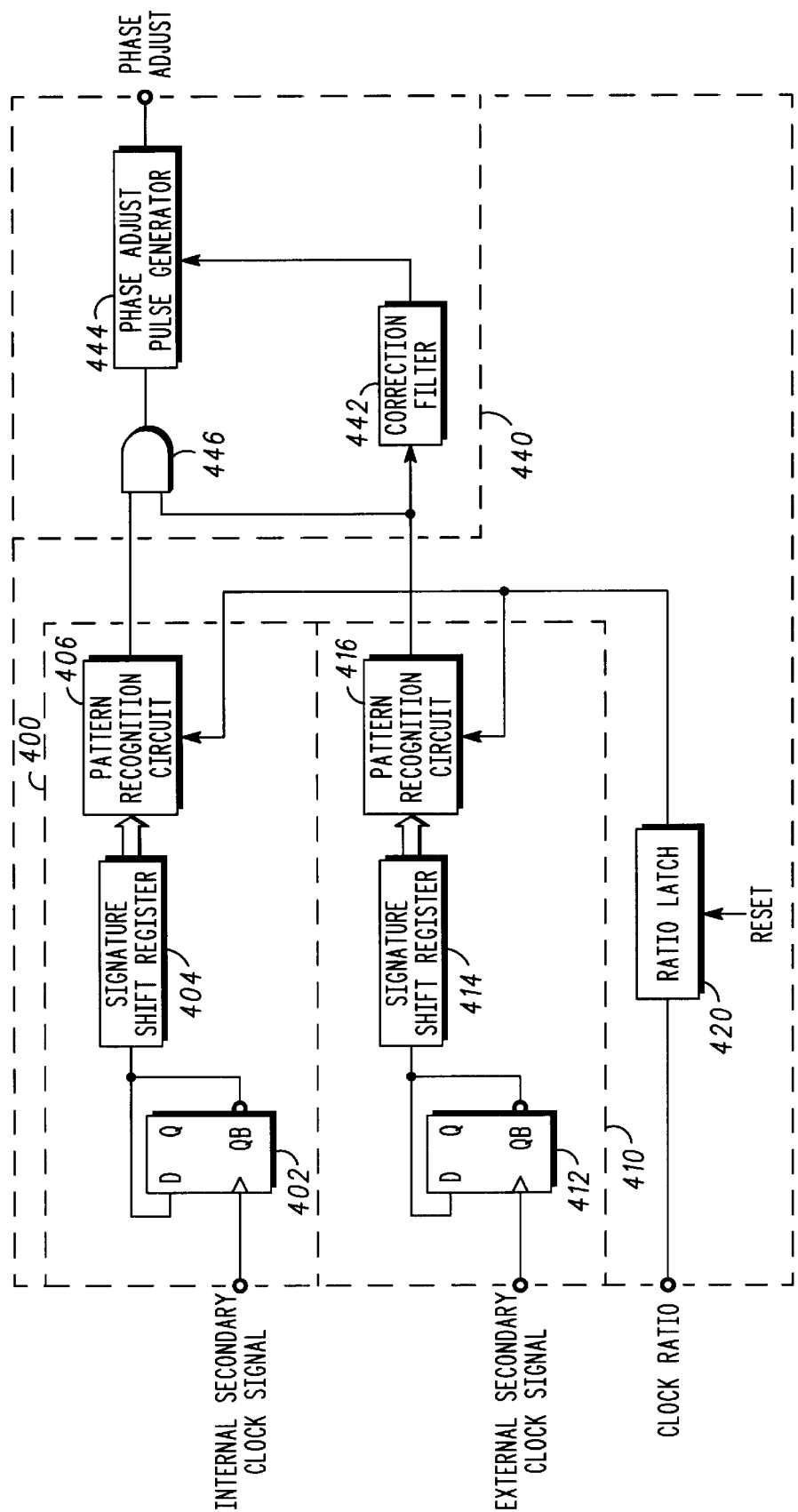
FIG. 4 is a circuit diagram of the phase adjustment circuit in an embodiment of the present invention.

A phase adjustment circuit 350 matches the phase of the internal secondary clock 136 with the phase of the external secondary clock 132. The phase adjustment circuit 350 compares the phase of the internal secondary clock signal to the phase of the external secondary clock signal. If a phase error is detected, the phase adjustment circuit 350 brings the internal secondary clock signal into phase with the external secondary clock signal. FIG. 4 is a block diagram of the phase adjustment circuit 350. The phase adjustment circuit 350 includes an internal sample logic unit 400 and an external sample logic unit 410. The internal sample logic unit 400 samples the internal secondary clock signal and the external sample logic unit 410 samples the external secondary clock signal in a functionally identical fashion.

The external sample logic unit 410 samples the external secondary clock signal to produce an external sample signature. The divisor 412 divides the external secondary clock signal by 2. It is noted with reference to FIG. 2 that for all ratios the rising edge of the external secondary clock 132 will always align with either a rising edge or a falling edge of the external primary clock 130. The falling edge of the external secondary clock 132 can sometimes occur somewhere between either edge of the internal secondary clock 136. The divisor 412 thus assures that a change in the level being sampled will always occur near a rising edge or a falling edge of the external primary clock 130. This allows for a larger margin of error due to clock skew when sampling the external secondary clock 132. Another benefit of the divisor 412 is that being sensitive only at the rising edge of a clock reduces any dependencies on the duty cycle of the clock. Additionally, the intrinsic delay of the divisor 412 adds hold time between the two secondary clock domains and the primary clock domain.

The signature shift register 414 is a five bit shift register that generates a history of the sampled clock levels over time. The levels are sampled with the rising edge of the external primary clock 130. The output of this block is an external sample signature, which is a five bit continuously changing signature of the sampled clock. The internal sample signature is then provided to a pattern recognition circuit 416. The pattern recognition circuit 416 matches the external sample signature to a pattern which corresponds to the synchronous multiple ratio and produces an external clock cycle signal which represents the start of a clock cycle of the external secondary clock signal.

The pattern recognition circuit 416 matches the external sample signature to the pattern by identifying one of five unique signatures depending on the clock ratio being implemented. The clock ratio to be applied is indicated by the ratio latch 420. By identifying a particular pattern associated with a known clock ratio, the pattern recognition circuit 416 determines exactly when the start of a single cycle of the external secondary clock signal will occur. FIG. 5 shows the patterns for which the pattern recognition circuit 416 searches for each of the five clock ratios. In each case the sampled pattern can be one of two cases. This results from the indeterministic state of the uninitialized divisor 412 at power up. The external sample logic unit 410 produces an external clock cycle signal representing a start of a clock cycle of the external secondary clock signal. FIG. 6 shows an example of how a sampled clock signature identifies the start of a single cycle.

The internal sample logic unit 400 is functionally identical to the external sample logic unit 410. The internal sample logic unit 400 includes a divisor 402 that divides the internal secondary clock signal by 2. A signature shift register 404 generates a history of the sampled clock levels over time and provides an internal sample signature to a pattern recognition circuit 406. The pattern recognition circuit 406 matches the internal sample signature to a pattern which corresponds to the synchronous multiple ratio to determine the start of a single cycle of the internal secondary clock signal. The internal sample logic unit 400 produces an internal clock cycle signal representing a start of a clock cycle of the internal secondary clock signal.

A phase adjust logic unit 440 compares the internal clock cycle signal to the external clock cycle signal and provides a phase adjust signal to the clock divider 310 to match the phase of the internal secondary clock signal with the phase of the external secondary clock signal. The phase adjust logic unit 440 has a correction filter 442 which determines when correction attempts may take place. The correction filter 442 permits a correction attempt every eight single cycles of the external secondary clock signal as indicated by the external clock cycle signal. The correction filter 442 permits the correction attempt by providing an adjust enable signal to a phase adjust pulse generator 444. When enabled for correction, the phase adjust pulse generator 444 identifies any difference between the internal clock cycle signal and external clock cycle signal indicated by the comparator 446. If a difference is detected, the phase adjust pulse generator 444 creates a phase adjust signal.

The phase adjust pulse generator 444 provides the phase adjust signal to the clock divider 310 of FIG. 3. The clock divider 310 double clocks the phase adjust signal to synchronize the phase adjust signal to the 4× internal clock signal. The clock divider 310 determines when a rising edge has occurred on the synchronized phase adjust signal. When the rising edge has been detected, the divide by n circuit 314 will stutter the generation of the internal secondary clock signal by one period of the internal 4× clock signal.

The phase adjustment circuit 350 continues to monitor the sampling differences between the internal secondary clock 136 and external secondary clock 132. This function continues to issue a phase adjust signal every eight single cycle periods to the clock divider 310 until a phase match between the internal secondary clock 136 and external secondary clock 132 has been detected. Once a phase match has been established there is no more phase adjust signal and all four clock domains remain fully synchronized and in perfect phase.

It should now be appreciated that the invention described herein provides the advantage of synchronization of a quad clock domain system. The present invention has been described above with reference to preferred embodiments. However, those skilled in the art will recognize that changes and modifications may be made in these preferred embodiments without departing from the scope of the present invention.

What is claimed is:

1. A synchronous quad clock domain system comprising:

an external primary clock controlling an external primary clock domain with an external primary clock signal;

an external secondary clock controlling an external secondary clock domain with an external secondary clock signal synchronized with the external primary clock signal with a synchronous multiple ratio;

an internal primary clock controlling an internal primary clock domain with an internal primary clock signal;

an internal secondary clock controlling an internal secondary clock domain with an internal secondary clock signal;

a phase lock loop circuit synchronizing the internal primary clock signal with the external primary clock signal;

a clock divider applying the synchronous multiple ratio to the internal primary clock signal to produce the internal secondary clock signal;

a phase adjustment circuit matching a phase of the internal secondary clock signal with a phase of the external secondary clock signal;

a phase delay circuit matching a rising edge of the internal secondary clock signal with a rising edge of the internal primary clock signal;

an external sample logic unit sampling the external secondary clock signal to produce an external sample signature and matching the external sample signature to a pattern corresponding to the synchronous multiple ratio to produce an external clock cycle signal representing a start of a clock cycle of the external secondary clock signal;

an internal sample logic unit sampling the internal secondary clock signal to produce an internal sample signature and matching the internal sample signature to a pattern corresponding to the synchronous multiple ratio to produce an internal clock cycle signal representing a start of a clock cycle of the internal secondary clock signal; and a phase adjust logic unit comparing the internal clock cycle signal to the external clock cycle signal and providing a phase adjust signal to the clock divider to match a phase of the internal secondary clock signal with a phase of the external secondary clock signal.

2. A synchronous quad clock domain system comprising:

an external primary clock controlling an external primary clock domain with an external primary clock signal;

an external secondary clock controlling an external secondary clock domain with an external secondary clock signal synchronized with the external primary clock signal with a synchronous multiple ratio;

an internal primary clock controlling an internal primary clock domain with an internal primary clock signal;

an internal secondary clock controlling an internal secondary clock domain with an internal secondary clock signal;

a phase lock loop circuit synchronizing the internal primary clock signal with the external primary clock signal;

a clock divider applying the synchronous multiple ratio to the internal primary clock signal to produce the internal secondary clock signal;

a phase adjustment circuit matching a phase of the internal secondary clock signal with a phase of the external secondary clock signal;

an external sample logic unit sampling the external secondary clock signal to produce an external sample signature and matching the external sample signature to a pattern corresponding to the synchronous multiple ratio to produce an external clock cycle signal representing a start of a clock cycle of the external secondary clock signal;

an internal sample logic unit sampling the internal secondary clock signal to produce an internal sample signature and matching the internal sample signature to a pattern corresponding to the synchronous multiple ratio to produce an internal clock cycle signal representing a start of a clock cycle of the internal secondary clock signal; and a phase adjust logic unit comparing the internal clock cycle signal to the external clock cycle signal and providing a phase adjust signal to the clock divider to match a phase of the internal secondary clock signal with a phase of the external secondary clock signal.

3. A synchronous quad clock domain system comprising:

an external primary clock controlling a system primary clock domain with an external primary clock signal;

an external secondary clock controlling a system secondary clock domain with an external secondary clock signal synchronized with the external primary clock signal with a synchronous multiple ratio;

an internal primary clock controlling an ASIC primary clock domain with an internal primary clock signal;

an internal secondary clock controlling an ASIC secondary clock domain with an internal secondary clock signal;

a phase lock loop circuit synchronizing the internal primary clock signal with the external primary clock signal;

a clock divider applying the synchronous multiple ratio to the internal primary clock signal to produce the internal secondary clock signal;

a phase adjustment circuit matching a phase of the internal secondary clock signal with a phase of the external secondary clock signal;

a phase delay circuit matching a rising edge of the internal secondary clock signal with a rising edge of the internal primary clock signal;

an external sample logic unit sampling the external secondary clock signal to produce a external sample signature and matching the external sample signature to a pattern corresponding to the synchronous multiple ratio to produce an external clock cycle signal representing a start of a clock cycle of the external secondary clock signal;

an internal sample logic unit sampling the internal secondary clock signal to produce a internal sample signature and matching the internal sample signature to a pattern corresponding to the synchronous multiple ratio to produce a internal clock cycle signal representing a start of a clock cycle of the internal secondary clock signal; and a phase adjust logic unit comparing the internal clock cycle signal to the external clock cycle signal and providing a phase adjust signal to the clock divider to match a phase of the internal secondary clock signal with a phase of the external secondary clock signal.

4. A synchronous quad clock domain system comprising:

an external primary clock controlling a system primary clock domain with an external primary clock signal;

an external secondary clock controlling a system secondary clock domain with an external secondary clock signal synchronized with the external primary clock signal with a synchronous multiple ratio;

an internal primary clock controlling an ASIC primary clock domain with an internal primary clock signal;

an internal secondary clock controlling an ASIC secondary clock domain with an internal secondary clock signal;

a phase lock loop circuit synchronizing the internal primary clock signal with the external primary clock signal;

a clock divider applying the synchronous multiple ratio to the internal primary clock signal to produce the internal secondary clock signal;

a phase adjustment circuit matching a phase of the internal secondary clock signal with a phase of the external secondary clock signal;

an external sample logic unit sampling the external secondary clock signal to produce a external sample signature and matching the external sample signature to a pattern corresponding to the synchronous multiple ratio to produce a external clock cycle signal representing a start of a clock cycle of the external secondary clock signal;

an internal sample logic unit sampling the internal secondary clock signal to produce a internal sample signature and matching the internal sample signature to a pattern corresponding to the synchronous multiple ratio to produce a internal clock cycle signal representing a start of a clock cycle of the internal secondary clock signal; and a phase adjust logic unit comparing the internal clock cycle signal to the external clock cycle signal and providing a phase adjust signal to the clock divider to match a phase of the internal secondary clock signal with a phase of the external secondary clock signal.

5. A synchronous quad clock domain system comprising:

an external primary clock controlling an external processor clock domain with an external primary clock signal;

an external secondary clock controlling an external input/output clock domain with an external secondary clock signal synchronized with the external primary clock signal with a synchronous multiple ratio;

an internal primary clock controlling an internal processor clock domain with an internal primary clock signal;

an internal secondary clock controlling an internal input/output clock domain with an internal secondary clock signal;

a phase lock loop circuit synchronizing the internal primary clock signal with the external primary clock signal;

a clock divider applying the synchronous multiple ratio to the internal primary clock signal to produce the internal secondary clock signal;

a phase adjustment circuit matching a phase of the internal secondary clock signal with a phase of the external secondary clock signal;

a phase delay circuit matching a rising edge of the internal secondary clock signal with a rising edge of the internal primary clock signal;

an external sample logic unit sampling the external secondary clock signal to produce an external sample signature and matching the external sample signature to a pattern corresponding to the synchronous multiple ratio to produce a external clock cycle signal representing a start of a clock cycle of the external secondary clock signal;

an internal sample logic unit sampling the internal secondary clock signal to produce a internal sample signature and matching the internal sample signature to a pattern corresponding to the synchronous multiple ratio to produce an internal clock cycle signal representing a start of a clock cycle of the internal secondary clock signal; and a phase adjust logic unit comparing the internal clock cycle signal to the external clock cycle signal and providing a phase adjust signal to the clock divider to match a phase of the internal secondary clock signal with a phase of the external secondary clock signal.

6. A synchronous quad clock domain system comprising:

an external primary clock controlling an external processor clock domain with an external primary clock signal;

an external secondary clock controlling an external input/output clock domain with an external secondary clock signal synchronized with the external primary clock signal with a synchronous multiple ratio;

an internal primary clock controlling an internal processor clock domain with an internal primary clock signal;

an internal secondary clock controlling an internal input/output clock domain with an internal secondary clock signal;

a phase lock loop circuit synchronizing the internal primary clock signal with the external primary clock signal;

a clock divider applying the synchronous multiple ratio to the internal primary clock signal to produce the internal secondary clock signal;

a phase adjustment circuit matching a phase of the internal secondary clock signal with a phase of the external secondary clock signal;

an external sample logic unit sampling the external secondary clock signal to produce a external sample signature and matching the external sample signature to a pattern corresponding to the synchronous multiple ratio to produce a external clock cycle signal representing a start of a clock cycle of the external secondary clock signal;

an internal sample logic unit sampling the internal secondary clock signal to produce a internal sample signature and matching the internal sample signature to a pattern corresponding to the synchronous multiple ratio to produce a internal clock cycle signal representing a start of a clock cycle of the internal secondary clock signal; and a phase adjust logic unit comparing the internal clock cycle signal to the external clock cycle signal and providing a phase adjust signal to the clock divider to match a phase of the internal secondary clock signal with a phase of the external secondary clock signal.

* * * * *